United States Patent
Shah et al.

(10) Patent No.: US 6,781,372 B2
(45) Date of Patent: Aug. 24, 2004

(54) IMAGING PROCESS IN THE SPATIAL FREQUENCY SPACE AND USEFUL FOR EXAMINING THE PROPERTIES OF OBJECT

(75) Inventors: Nadim Joni Shah, Linnich (DE); Karl Zilles, Köln (DE)

(73) Assignee: Forschungszentrum Jülich GmbH, Jülich (DE)

( * ) Notice: Subject to any disclaimer, the term of this patent is extended or adjusted under 35 U.S.C. 154(b) by 133 days.

(21) Appl. No.: 09/742,470

(22) Filed: Dec. 21, 2000

(65) Prior Publication Data

US 2001/0024120 A1 Sep. 27, 2001

(30) Foreign Application Priority Data

Dec. 24, 1999 (DE) ......................................... 199 62 845

(51) Int. Cl.$^7$ ................................................. G01V 3/00
(52) U.S. Cl. ....................................................... 324/307
(58) Field of Search ................................ 324/300–309

(56) References Cited

U.S. PATENT DOCUMENTS

| | | | | |
|---|---|---|---|---|
| 4,574,240 A | * | 3/1986 | Libove et al. | 324/306 |
| 5,241,271 A | * | 8/1993 | Taguchi et al. | 324/309 |
| 5,243,284 A | * | 9/1993 | Noll | 324/309 |
| 5,423,317 A | * | 6/1995 | Iijima et al. | 600/410 |
| 5,500,593 A | * | 3/1996 | Loncar et al. | 324/307 |
| 5,525,906 A | * | 6/1996 | Crawford et al. | 324/322 |
| 5,604,435 A | * | 2/1997 | Foo et al. | 324/309 |
| 5,666,434 A | * | 9/1997 | Nishikawa et al. | 382/128 |
| 5,682,891 A | * | 11/1997 | Sonoki et al. | 600/410 |
| 5,757,188 A | * | 5/1998 | Miyazaki | 324/309 |
| 5,830,143 A | * | 11/1998 | Mistretta et al. | 600/420 |
| 5,912,557 A | * | 6/1999 | Wilman et al. | 324/309 |
| 6,018,600 A | * | 1/2000 | Levin et al. | 382/284 |
| 6,064,204 A | * | 5/2000 | Lindstedt | 324/309 |
| 6,144,874 A | * | 11/2000 | Du | 600/413 |
| 6,201,393 B1 | * | 3/2001 | Bernstein et al. | 324/309 |
| 6,281,681 B1 | * | 8/2001 | Cline et al. | 324/310 |
| 6,289,232 B1 | * | 9/2001 | Jakob et al. | 600/410 |
| 6,381,486 B1 | * | 4/2002 | Mistretta et al. | 600/420 |
| 6,414,487 B1 | * | 7/2002 | Anand et al. | 624/309 |
| 6,448,771 B1 | * | 9/2002 | Harvey et al. | 324/307 |
| 6,476,607 B1 | * | 11/2002 | Dannels et al. | 324/309 |

* cited by examiner

Primary Examiner—Christopher W. Fulton
Assistant Examiner—Dixomara Vargas
(74) Attorney, Agent, or Firm—Connolly Bove Lodge & Hutz LLP

(57) ABSTRACT

The present invention relates to a process for examining an object, whereby properties of the object are detected at different times within a spatial frequency space formed by spatial frequencies. The process is carried out in such a way that consecutive images are recorded in overlapping areas of the spatial frequency space and, additionally, in areas of the spatial frequency space that differ from each other.

8 Claims, 1 Drawing Sheet

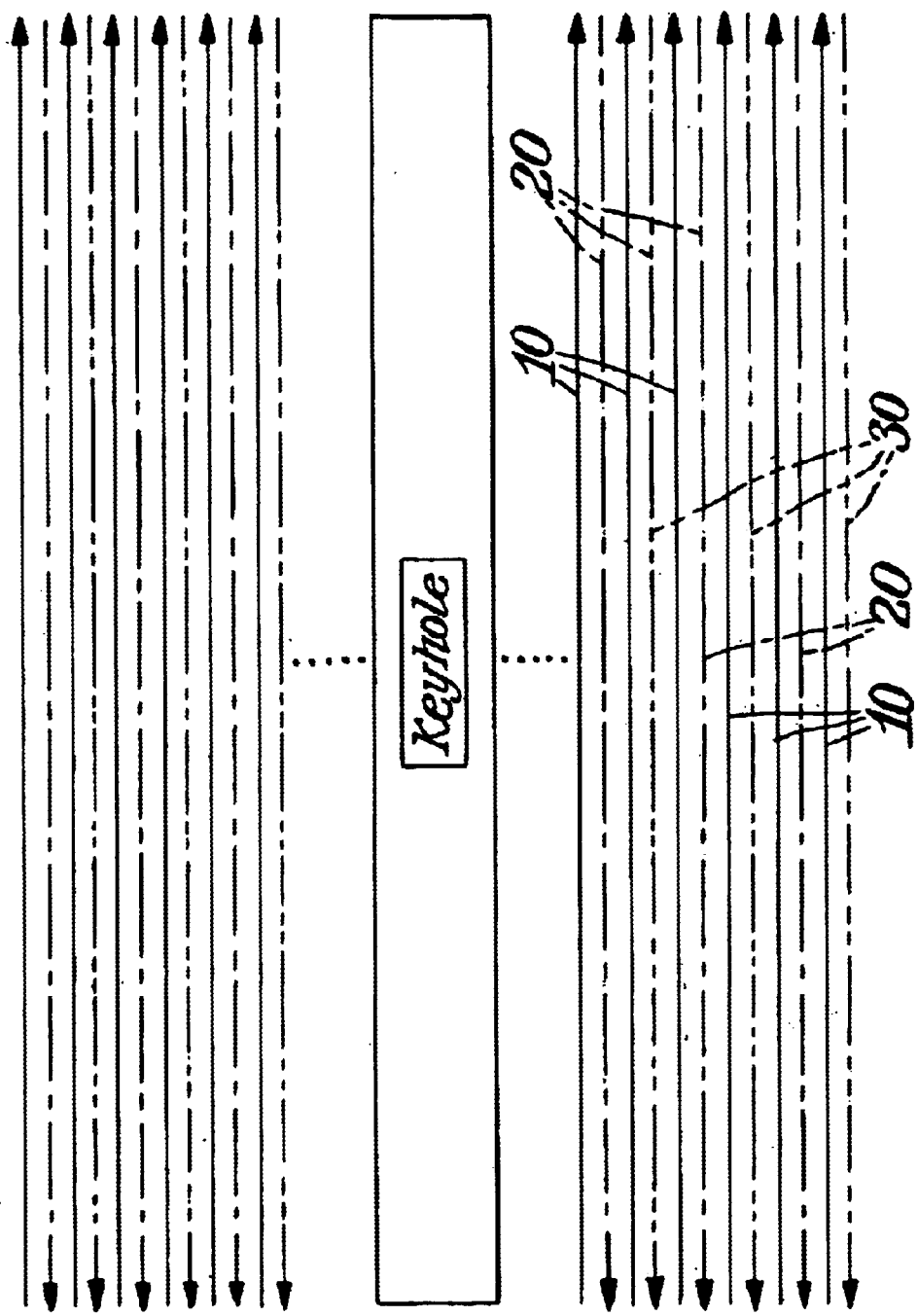

IMAGING PROCESS IN THE SPATIAL FREQUENCY SPACE AND USEFUL FOR EXAMINING THE PROPERTIES OF OBJECT

BACKGROUND OF THE INVENTION

A. Field of the Invention

The present invention relates generally to a process to examine at least one object, whereby properties of the object are detected by various measurements within a spatial[-] frequency space formed by spatial frequencies. Preferably, the various measurements take place at different times. The present invention may be used to analyze the properties of various objects, such as for example, any object that may be imaged, any object typically measured using magnetic resonance imaging or nuclear magnetic resonance techniques, etc.

B. Description of the Related Art

Examinations of the spatial[-] frequency space are employed in a wide array of technical fields. Since pulse spaces correspond to spatial[-] frequency spaces, the term "spatial frequency space" also encompasses pulse spaces. [The designation spatial-frequency space serves to clarify the fact that the invention also relates to a process in which no pulse transmission occurs.] A known problem encountered when imaging spatial[-] frequency spaces is that a very long measuring time is needed when a high local resolution is combined with a high spatial frequency resolution.

A keyhole process for solving this problem is known. In this process, a high-resolution image involving the detection of the entire spatial[-] frequency space is determined at least for one point in time. In one or more measuring steps, a central area of the spatial[-] frequency space is imaged that determines the contrast of the reconstructed image. Subsequently, the high-resolution image is mathematically linked to the recorded image(s) of the central areas of the spatial[-] frequency space in such a way that a high-resolution image having a contrast that corresponds to the point in time of the recording is determined for the other time or times.

This known process has the disadvantage that contrast changes between consecutive measurements can only be determined if they have a sufficiently large spatial extension. This disadvantage is particularly detrimental when functional parameters of the object are being detected. Thus, for instance, in functional magnetic resonance imaging, there is a need for parameters that influence nuclear magnetic resonance signals to be detected with the highest possible spatial resolution.

Thus, there is a need in the art for a process to examine the properties of an object within a spatial frequency space, especially the functional parameters of the object, that overcomes the problems of the related art.

SUMMARY OF THE INVENTION

The present invention [is based on the objective of creating] solves the problems of the related art by providing a process [with which it is possible to detect] for examining an object that enables detection of a change in the functional parameters of the object when the spatial areas affected by the change are relatively small. The process of the present invention occurs in the spatial frequency space. That is, no pulse transmission occurs in the process of the present invention.

More specifically, the process of the present invention solves the problems of the related art by taking various measurements in at least one shared area of the spatial frequency space and, additionally, in areas of the spatial frequency space that are different from each other. Preferably, the measurements detect the spatial frequency space in images taken at different times. In particular, the process of the present invention provides for examining areas of the spatial frequency space at rates of occurrence that differ from each other. More preferably, the process of the present invention provides for examining areas of the spatial frequency space at three or more different rates of occurrence for detecting areas.

Preferably, at least one, for example, centrally located area of the spatial frequency space is detected in several measurements while other areas are not detected at all, or are only detected in a single measuring procedure. Preferably the process is carried out in such a way that the overlapping areas cover a central region of the spatial frequency space.

In one aspect of the process of the present invention, the additional, but preferably not central, areas in the spatial frequency space are at a distance from each other that is greater than their spatial frequency extension in the direction of this distance. Preferably, the process is carried out in such a way that the other areas of the spatial frequency space extend, at least partially, parallel to each other. More preferably the disjunctive elements of the individual sets extend, at least partially, parallel to each other in the spatial frequency space.

In another aspect of the process of the present invention, the measurements are carried out in such a way that a cycle is formed in which at least some of the areas of the spatial frequency space that differ from each other are once again detected in additional measurements. In still another aspect of the process of the present invention, the detected areas that form a disjunctive set in at least one measurement.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic diagram showing a process for detecting the properties of an object using various measurements within a spatial frequency space formed by spatial frequencies in accordance with an embodiment of the present invention.

DESCRIPTION OF AN EMBODIMENT OF THE PRESENT INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof The process of the present invention for detecting the properties of an object using various measurements within a spatial frequency space formed by spatial frequencies is shown generally in FIG. 1. The image shows the detection of a spatial frequency space having, by way of example only, N×N points. For purposes of simplifying the graphical representation, a two-dimensional depiction was chosen, although the invention is by no means restricted to the detection of two-dimensional spatial frequency spaces, but rather, it is suitable to detect spatial frequency spaces having any desired number of dimensions.

A first step of the process of the present invention detects a central area 1 as well as areas 10 (represented here in the form of solid lines) of the spatial frequency space that are at a distance from the central area 1, and that are preferably essentially parallel to the spatial frequency space.

In a subsequent step of the process of the present invention, the central area 1 is detected once again. In addition, other areas 20 (represented by the dash-dot lines) of the spatial frequency space that lie outside of the central area 1 are also detected. The other areas 20 of the spatial frequency space preferably extend essentially parallel to each other and to the other areas 10 detected in the first step of the process. Other areas 20, however, preferably extend in a direction opposite the direction other areas 10 extend, as shown by the left arrows for other areas 20 and the right arrows for other areas 10.

Subsequently, the third step of the process of present invention is performed. In this step, the central area 1 as well as other areas 30 (indicated by the dotted lines) of the spatial frequency space are detected. The other areas 30 of the spatial frequency space preferably extend essentially parallel to each other and to the other areas 10, 20 detected in the first and second steps of the process, respectively. Other areas 30, however, also extend in a same direction as the direction other areas 10 extend, as shown by the right arrows for other areas 10 and 30.

By selectively detecting the high-frequency data, the time advantage of a keyhole method is essentially maintained using the process of the present invention. Moreover, noise effects are suppressed in the process of the present invention. Furthermore, the images shown have a high spatial resolution corresponding to the overall images of the spatial frequency space.

By way of example only and without limiting the scope of the present invention, it is particularly advantageous to image a suitable SPARCE sequence. Preferably, an imaging pattern corresponds to a SPARCE sequence having the following formula:

SPARCE $(f, n) = [N/2-n, N/2-f-n, N/ 2-2f-n, \ldots$
(KEYHOLE) $\ldots -N/2+3f-n, -N/2+2f-n, -N/2+f-n]$ Preferably, the entire spatial frequency space is imaged, whereby the spatial frequency space can be considered, for example, to be an N×N image matrix. The image matrix has a slight covering of high spatial frequencies as well as a more thoroughly covered, so-called keyhole area. A SPARCE sequence, SPARCE <f, n>, contains indices f, n, wherein f stands for an image factor and n for a running time variable, whereby it applies that (0<n<f).

By means of a relatively small or infrequent detection of areas having high spatial frequencies, a time advantage is achieved with the process of the present invention, in addition to which the correlation between high-frequency noises is reduced, which is something particularly advantageous. Another improvement in the process of the present invention can be achieved with an even-numbered sampling factor f in that even and odd echoes are detected separately.

It will be apparent to those skilled in the art that various modifications and variations can be made in the process for detecting the properties of an object of the present invention and in construction of this process without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A process for increasing the temporal rate at which an image of an object is acquired using measurements within a spatial frequency space while maintaining a local resolution and spatial frequency resolution of the image, the object being imaged by one of magnetic resonance imaging (MRI) or nuclear magnetic resonance (NMR), the process comprising:

detecting a central area and first areas of the spatial frequency space, the first areas being a first distance from the central area and extending in a first direction;

detecting the central area and second areas of the spatial frequency space, the second areas being a second distance from the central area and extending in a second direction that is opposite to the first direction;

detecting the central area and third areas of the spatial frequency space, the third areas being a third distance from the central area and extending in the first direction; and using the detected areas of the spatial frequency space to increase the temporal rate at which the image of the object is acquired using one of MRI or NMR, while maintaining the local resolution and the spatial frequency resolution of the image.

2. The process according to claim 1, wherein the first, second, and third areas of the spatial frequency space are spaced at different distances from the central area.

3. The process according to claim 1, wherein the areas of the spatial frequency space that overlap cover the central area.

4. The process according to claim 1, wherein the first, second, and third areas of the spatial frequency space have higher spatial frequencies than the central area.

5. The process according to claim 1, wherein the first, second, and third areas of the spatial frequency space extend substantially parallel to each other.

6. The process according to claim 1, wherein elements of one of the first, second, or third areas of the spatial frequency space form a disjunctive set.

7. The process according to claim 6, wherein the disjunctive set of elements extend substantially parallel to each other in the spatial frequency space.

8. The process according to claim 1, wherein the process suppresses noise effects.

* * * * *